(12) United States Patent
Thomas et al.

(10) Patent No.: US 8,320,198 B2
(45) Date of Patent: Nov. 27, 2012

(54) SRAM MEMORY CELL WITH DOUBLE GATE TRANSISTORS PROVIDED MEANS TO IMPROVE THE WRITE MARGIN

(75) Inventors: Olivier Thomas, Revel (FR); Bastien Giraud, Sanary sur Mer (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 171 days.

(21) Appl. No.: 12/866,821

(22) PCT Filed: Feb. 16, 2009

(86) PCT No.: PCT/EP2009/051819
§ 371 (c)(1),
(2), (4) Date: Aug. 9, 2010

(87) PCT Pub. No.: WO2009/103687
PCT Pub. Date: Aug. 27, 2009

(65) Prior Publication Data
US 2010/0315889 A1 Dec. 16, 2010

(30) Foreign Application Priority Data
Feb. 18, 2008 (FR) .................................... 08 51027

(51) Int. Cl.
*G11C 7/00* (2006.01)
(52) U.S. Cl. ............ 365/189.11; 365/154; 365/189.011; 365/226; 365/230.03
(58) Field of Classification Search .............. 365/189.11, 365/154, 230.03, 189.01, 226, 189.011
See application file for complete search history.

(56) References Cited

U.S. PATENT DOCUMENTS

| | | | |
|---|---|---|---|
| 5,793,671 A | 8/1998 | Selcuk | |
| 5,852,572 A | 12/1998 | Jung et al. | |
| 5,991,192 A | 11/1999 | Wang et al. | |
| 6,529,400 B1 | 3/2003 | Bhavnagarwala et al. | |
| 6,839,299 B1 * | 1/2005 | Bhavnagarwala et al. | ... 365/226 |
| 7,259,986 B2 * | 8/2007 | Bhavnagarwala et al. | ......... 365/185.02 |
| 7,307,899 B2 * | 12/2007 | Khellah et al. | ............ 365/189.11 |
| 7,372,721 B2 * | 5/2008 | Sachdev et al. | ............... 365/154 |
| 7,511,989 B2 | 3/2009 | Thomas et al. | |
| 7,768,821 B2 | 8/2010 | Thomas et al. | |
| 7,782,655 B2 * | 8/2010 | Shau | ............................ 365/154 |
| 2007/0139072 A1 | 6/2007 | Yamaoka et al. | |
| 2009/0294861 A1 | 12/2009 | Thomas et al. | |
| 2010/0096700 A1 | 4/2010 | Vinet et al. | |
| 2010/0178743 A1 | 7/2010 | Vinet et al. | |

OTHER PUBLICATIONS

Guo, Z., et al., "FinFet-Based SRAM Design," UC Berkeley, ISLPED, San Diego, California, USA, pp. 2-7, (2005).

(Continued)

*Primary Examiner* — Pho M Luu
(74) *Attorney, Agent, or Firm* — Oblon, Spivak, McClelland, Maier & Neustadt, L.L.P.

(57) ABSTRACT

A random access memory cell including: two double-gate access transistors respectively arranged between a first bit line and a first storage node and between a second bit line and a second storage node, a word line, a first double-gate load transistor and a second double-gate load transistor, a first double-gate driver transistor and a second double-gate driver transistor, a mechanism to apply a given potential to at least one electrode of each of the load or driver transistors, and a mechanism to cause the given potential to vary.

22 Claims, 10 Drawing Sheets

OTHER PUBLICATIONS

Yamaoka, M., et al., "Low Power SRAM Menu for SOC Application Using Yin-Yang-Feedback Memory Cell Technology," SYRNP, VLSI Curcuits Dig. 18, total 4 pages, (2004).

Giraud, B., et al., "A Comparative Study of 6T and 4T SRAM Cells in Double-Gate CMOS with Statistical Variation," ISCAS, New Orleans, USA, total 3 pages (May 2007).

Seevinck, E., et al., "Static-Noise Margin Analysis of MOS SRAM Cells," IEEE Journal of Solid-State Circuits, vol. SC-22, No. 5, pp. 748-754, (Oct. 1987).

Giraud, B., et al., "In-depth Analysis of 4T SRAM Cells in Double-Gate CMOS," ICICDT, Austin, USA, pp. 1-4, (May 2007).

Reyboz, M., et al., "Explicit $V_{th}$ Based Compact Model of Independent DG MOSFETs with Short Channel Effects," CEA, Grenoble, France, pp. 1-4, (2006).

Guo, A.C., et al., "FinFET SRAM with Enhanced Read / Write Margins," IEEE International SOI Conference Proceedings, pp. 105-106, (2006).

International Search Report issued Jun. 19, 2009 in PCT/EP09/051819 filed Feb. 16, 2009.

U.S. Appl. No. 12/521,377, filed Sep. 14, 2009, Vinet, et al.

U.S. Appl. No. 12/521,311, filed Dec. 3, 2009, Vinet, et al.

\* cited by examiner

SRAM MEMORY CELL WITH DOUBLE GATE TRANSISTORS PROVIDED MEANS TO IMPROVE THE WRITE MARGIN

TECHNICAL AREA

The invention relates to the area of Random Access Memories (RAMs) and particularly concerns a special structure of static memory cell with random access provided with double gate transistors.

Said structure is notably provided with means to improve the write margin (WM) of the cell.

The invention also concerns a memory comprising a plurality of said cells.

STATE OF THE PRIOR ART

A conventional SRAM memory cell (Static Random Access Memory) generally comprises two inverters, connected in a so-called <<flip-flop>> configuration and two access transistors connected to so-called bit lines and controlled by a word line.

The desired characteristics for a memory cell are:
- good stability during different operations: read, write, retention, performed on the cell,
- a drive or load current that is as strong as possible to impart high operating speed to the cell,
- the lowest possible current in retention mode to minimize static consumed power,
- a minimum cell size to form a memory with high density of cell integration.

The two first criteria are difficult to reconcile with the last criterion, and lead memory designers to making compromises in relation to the intended applications.

SRAM cells with six transistors called <<6T>> cells offer a good compromise between all the above-mentioned criteria.

In FIG. 1, a cell 100 of a standard SRAM memory is illustrated. This cell 100 is formed of 2 driver transistors $MD_L$ and $MD_R$ and of 2 load transistors $ML_L$ and $ML_R$, connected in a so-called <<flip-flop>> configuration, and of two access transistors $MA_L$ and $MA_R$ respectively connected to so-called bit lines $BL_L$ and $BL_R$, and controlled by a word line WL. The access transistors $MA_L$ and $MA_R$ are designed to allow or to block access respectively to a first node L, in charge of holding first logic data e.g. logic '1', and to a second node R in charge of holding second logic data complementing the first data e.g. logic '0.

It is sought to reduce the size of transistors, which tends to increase the influence of leakage currents related in particular to short channel effects (SCEs) and to influence dispersions of electric characteristics between transistors, owing to the method of fabrication and to doping steps in particular. This results in degradation of the electric characteristics of the memory cells formed of said transistors.

The performance levels of memory cells are characterized by several factors: read and retention stability, static consumption, the maximum number of cells per column, write margin, write time, write sensitivity, critical load.

Two factors assume particular importance; the write margin (WM) and the static noise margin (SNM) insofar as, with respect to transistor technologies with gates of critical size of less than 45 nm also called <<sub-45 nm>>, it is increasingly more difficult to arrive at a good compromise between these two factors, notably on account of the increase in variations of methods used and the increase in leakage currents related to short channel effects.

Producing SRAM cells on a substrate of silicon-on-insulator type (SOI) or producing cells provided with double gate transistors (DG) e.g. using FET technology, may allow an improvement in electric characteristics compared with cells fabricated on a bulk substrate.

SOI and DG technologies allow better electrostatic control over the channel, and generate less leakage current and fewer short channel effects (SCEs). Also, the absence of dopants in the substrate can allow a substantial reduction in electric dispersions between transistors and between cells.

DG technology also offers the advantage of control over a transistor with two gates, each gate able to be electrically controlled independently of the other. This dual control offers an additional degree of design, allowing optimization of the electric characteristics of the cells.

One operating mode of the previously described cell 100 will now be given.

Prior to placing in read mode, the bit lines $BL_L$ and $BL_R$ of the cell can be charged at a potential VDD. For this cell 100 the most unstable node is generally the node which contains logic-0 data, for example the second node.

The first order stability of the second node R can then be governed by the following inequation:

$$I_{G-LL} + I_{OFF-LR} + I_{ON-AR} \leq I_{ON-DR} \quad (1)$$

in which: $I_{G-LL}$ is the gate current of the first load transistor $ML_L$, $I_{OFF-LR}$ is the leakage current of the second load transistor $ML_R$, $I_{ON-AR}$ and $I_{ON-DR}$ are the respective drive currents of the second access transistor $MA_R$ and of the second driver transistor $MD_R$.

By neglecting the gate and leakage currents of the load transistors, the preceding inequation (1) can be written as follows:

$$I_{ON-AR} \leq I_{ON-DR} \quad (2)$$

The first order read stability of the cell 100, depends at first order on a conductivity ratio $CR_{6T}$ of the access and driver transistors whose drains are connected to the node of low potential $$CR_{6T} = \frac{(W/L)_{MD_R}}{(W/L)_{MA_R}},$$

and the second order stability depends on the conductivity of the load transistor whose gate is connected to this same potential $(W/L)_{ML_L}$.

The write margin of cell 100 corresponds to a minimum voltage difference between the bit lines $BL_L$ and $BL_R$ allowing writing in the enabled cell.

The write margin of cell 100 essentially depends on a ratio denoted $PR_{6T}$ such that $$PR_{6T} = \frac{(W/L)_{ML_L}}{(W/L)_{MA_L}}$$

of the transistors whose drains are connected to the storage node L='1'. The more this ratio decreases, the more the discharge of the storage node L becomes easier and the more the write margin is improved.

The conductivity ratios $CR_{6T}$ and $PR_{6T}$ follow from 2 antagonistic criteria.

New cell architectures for SRAM memories have been proposed to improve one of these two criteria or to find a compromise between these two criteria.

Document [1] (referenced at the end of the present description, as are the other documents cited herein) discloses a double gate 6-transistor cell fabricated using finFET technology with a gate length in the order of 22 nm.

Said cell 100 is shown FIG. 2, and differs from cell 100 previously described through its back gate connections of the access transistors $MA_L$ and $MA_R$ to the adjacent storage nodes. Read stability is thereby improved. This feedback also allows retention stability to be improved, but greatly deteriorates performance during write operations and limits the maximum number implantable cells per column of a memory array (the determination of said number being defined for example in document [6]).

An architecture with 7 transistors (7T) described in document [2] allows the potentials of the 2 storage nodes L and R to be equalized just before a write operation, by means of an additional transistor Meq. The drain/source electrodes of the latter are connected to the storage nodes L and R. The write margin and the time to perform a write operation are improved compared with the previously described cells. FIG. 3 illustrates said cell 120. Its disadvantages are: in particular an increase in occupied surface area and increased control complexity.

One variant of a 6T SRAM memory cell fabricated using SOI technology and a double gate was also presented in document [3]. FIG. 4 illustrates an example of said cell 130, in which the back gates of the access transistors are connected to a potential VSS to reduce the drive current of the access transistors. The stability condition given previously by inequation (2) is therefore improved. The back gates of the load transistors $ML_L$ and $ML_R$, are connected to a supply voltage VDD making it possible to improve the write operation by reducing the conduction of the load transistors. Nonetheless, it also has the effect of reducing second order stability by deteriorating the maintaining of node L.

Another cell 140, with 6 transistors and fabricated using double gate technology is given FIG. 5. This cell 140 has an improved write margin compared with cell 110.

Said cell 140 has improved stability by means of feedback between the back gates of the access transistors $MA_L$, $MA_R$ and the adjacent storage nodes L and R. The write operation is improved as in cell 130 previously described. On the other hand, the second order stability is deteriorated compared with the double gate 6T cell referenced 110 and previously described with reference to FIG. 3.

Compared with the conventional cell 100, the maximum number of cells per column, the write time and the write margin of cells 130 and 140 are deteriorated.

Cells with strong integration density and 4 transistors (4T) have also been used and these allow a very good write margin to be obtained.

In FIG. 6, a cell 150 with 4 double gate transistors is illustrated. This cell 150 is formed of driver transistors $MD_L$ and $MD_R$, and of two access transistors $MA_L$ and $MA_R$. Said cell 150 does not comprise a load transistor.

FIG. 7 illustrates a variant of cell 160 with 4 double gate transistors. This cell 160 is formed of 2 load transistors $ML_L$ and $ML_R$, and of two access transistors $MA_L$ and $MA_R$. This cell 160 does not comprise a driver transistor.

Said 4T cells offer a compromise between retention-read stability that is much less advantageous than 6T cells. Also, a 4T cell in retention mode is sensitive to the write cycles of cells sharing the same column.

Document [7] discloses a random access memory in which a potential, applied to a gate electrode of each of the load and driver transistors, is caused to vary.

The objective of this document is to reduce leakage currents.

In this arrangement of SRAM cell, the voltage that can be applied to the gate of the load or driver transistors is limited by the breakdown voltage of the gate dielectric of the load transistors.

The problem arises of finding a novel structure for double gate SRAM cell, in particular having 6 transistors, in which the compromise between read stability and write margin is improved.

DISCLOSURE OF THE INVENTION

The invention firstly concerns a static random access memory cell (SRAM), comprising:

- a first access transistor with double gate and a second access transistor with double gate, respectively arranged between a first bit line and a first storage node, and between a second bit line and a second storage node,
- a word line connected to a first gate electrode of the first access transistor and to a first gate electrode of the second access transistor,
- a first load transistor with double gate and a second load transistor with double gate,
- a first driver transistor with double gate and a second driver transistor with double gate, a so-called <<reference>> potential being applied to the second gate of the load or driver transistors, the cell comprising:

- means to apply a given VCELL potential to at least one source or drain electrode of each of the load or driver transistors,
- means to cause said given potential VCELL to vary.

The reference potential may be a supply voltage equal to Vdd for example, or a ground potential equal to Vss for example.

Said cell is designed to assume different operating modes including at least one data read mode, at least one data write mode and at least one data retention mode.

The given potential VCELL may assume different values, depending on whether the cell is in read, write or retention mode.

The means to cause said given potential VCELL to vary can therefore be designed to cause said given potential VCELL to vary in relation to the operating mode in which the cell is placed.

According to the invention, the given potential VCELL applied during write phases of the cell is designed to be different from the reference potential (which may for example be at Vdd or Vss) and so as to produce a lower drive current of the load or driver transistors than when the given potential VCELL and the reference potential (for example equal to Vdd or Vss) are equal.

According to a first possible embodiment, the means to apply said given potential VCELL can be formed of a specific, additional polarization line.

Said additional polarization line can be connected to the source of the load transistors. In this case, the given potential VCELL is advantageously not limited by the breakdown voltage of the gate dielectric of the load transistors.

According to this possibility, the load transistors may comprise a gate electrode connected to a potential VDD.

In this case, the means to apply said given potential and the means to cause said given potential to vary can be arranged, during at least one data write phase in the cell: to apply to the source of the load transistors a potential $VCELL=VDD-\sigma V$, with $\sigma V>0$.

This notably facilitates discharge of the storage node of logic level '1'.

According to this possibility, the means to apply said given potential and the means to cause said given potential to vary can also be arranged during at least one data read phase of the cell: to apply, to the source of the load transistors, a potential VCELL=VDD.

This notably facilitates the maintaining of one of the storage nodes at logic level '1' and the guarantee of good read stability.

According to this possibility, the means to apply said given potential and the means to cause said given potential to vary can also be designed, during at least one data retention phase in the cell: to apply, to the source of the load transistors, a potential VDD−σV, in which σV>0.

This notably allows leakage currents to be reduced.

According to the first possible embodiment, during data write phases in said cell, a potential difference $V_{G1}-V_s$ such that $V_{G1}-V_s=σV$ in which σV>0 volt can be applied between a first gate electrode and the source electrode of each of the load transistors.

According to said first possible embodiment of the cell, during data read phases in said cell, it is possible to apply a zero potential difference $V_{G1}-V_s$ between said first gate electrode and said source electrode, of each of the load transistors.

According to said first possible embodiment of the cell, during data retention phases in said cell, it is possible to apply a potential difference $V_{G1}-V_s$ such that $V_{G1}-V_s=σV$ in which σV>0 volt between said first gate electrode and said source electrode, of each of the load transistors.

The cell can be implemented so that $σV=V_{TN}$ in which $V_{TN}$ is the threshold voltage of a double gate transistor.

According to one possible embodiment of the means to cause said given potential to vary, these means may comprise:
a polarization line set at a fixed potential,
at least one first switching transistor with double gate and at least a second switching transistor with double gate between the given polarization line and said polarization line set at a fixed potential, the first switching transistor having technology complementing the technology of the second transistor, the gates of the first switching transistor and of the second switching transistor being connected together.

According to a second possible embodiment of the cell, the means to apply said given potential VCELL may be said word line.

Said word line can be connected to the source of the load transistors.

The load transistors may comprise a gate electrode connected to a potential VDD.

In this case, the means to apply said given potential and the means to cause said given potential to vary may also be designed: during a least one data write phase in the cell, to apply a potential VCELL such that VCELL<VDD.

The means to apply said given potential and the means to cause said given potential to vary may be designed: to apply, to the source electrode of the load transistors during at least one data retention phase of the cell, a potential VCELL such that VCELL=VDD.

The means to apply said given potential and the means to cause said given potential to vary may be designed: during at least one data read phase in the cell, to apply a potential VCELL such that VCELL<VDD.

According to one possibility, the first access transistor may comprise a second gate electrode connected to the second storage node, the second access transistor comprising a second gate electrode connected to the first storage node. Said configuration may allow improved read stability.

According to one variant, the word line can be connected to the source of the driver transistors.

In this case, the driver transistors may comprise a gate electrode connected to a potential VSS.

The means to apply said given potential and the means to cause said given potential to vary, may then be designed: during at least one data write phase in the cell, to apply a potential VCELL>VSS.

The means to apply said given potential and the means to cause said given potential to vary may also be designed: during at least one data retention phase of the cell, to apply a potential VCELL=VSS.

The means to apply said given potential and the means to cause said given potential to vary may also be designed: during at least one data read phase in the cell, to apply a potential VCELL>VSS. (means equivalent to those in FIG. 11.

BRIEF DESCRIPTION OF THE DRAWINGS

The present invention will be better understood on reading the description of examples of embodiment given solely for indication purposes and in no way limiting, with reference to the appended drawings in which.

Identical, similar or equivalent parts in the different figures carry the same number references to facilitate cross-reading between the figures.

The different parts illustrated in the figures are not necessarily shown to uniform scale, for better legibility of the figures.

DETAILED DESCRIPTION OF PARTICULAR EMBODIMENTS

Figure 1:
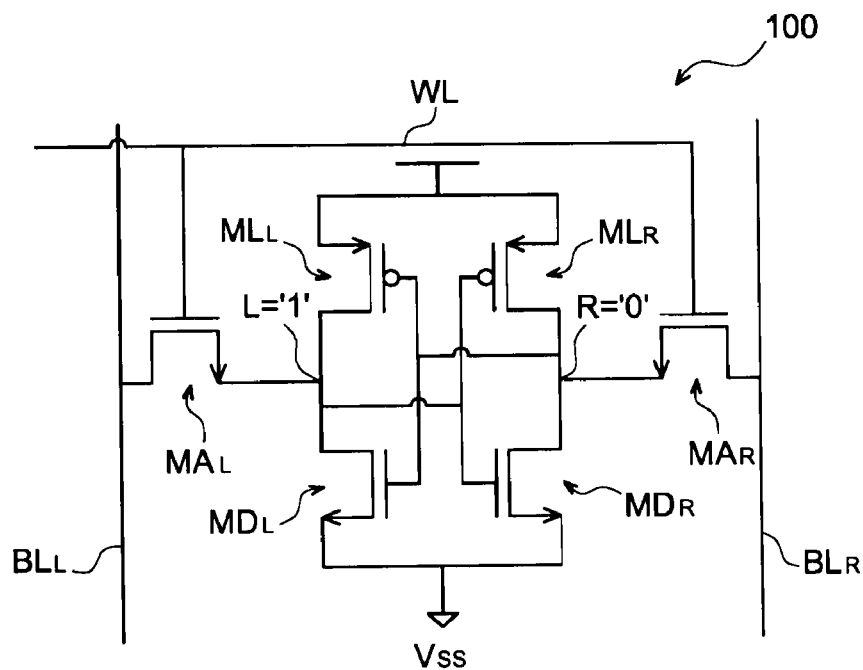
FIG. 1, illustrates an example of a 6T static random access memory cell of the prior art.
Figure 2:
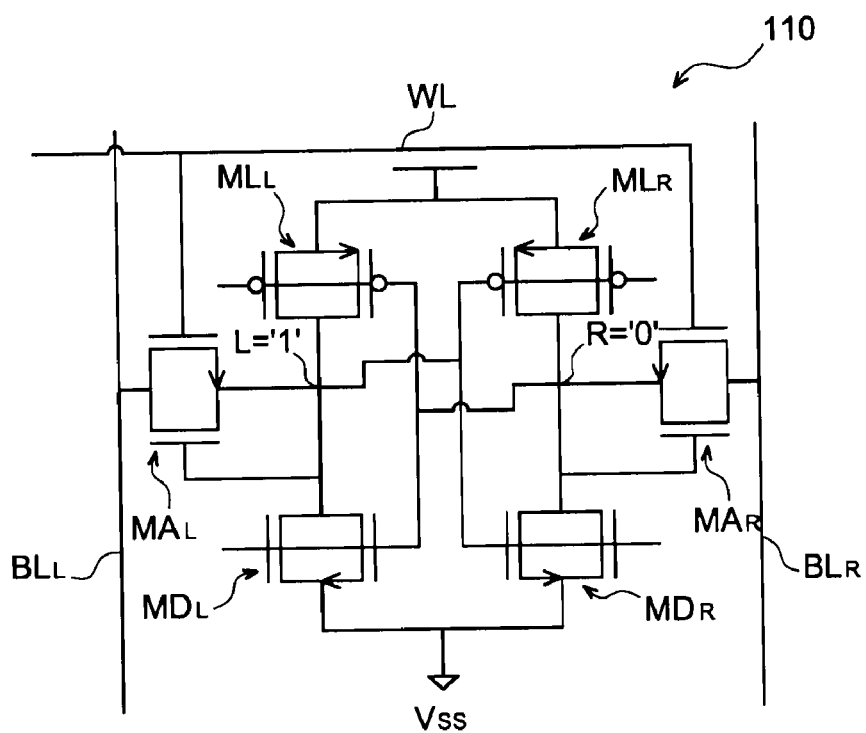
FIG. 2, illustrates an example of a memory cell in the prior art provided with 6 double gate transistors.
Figure 3:
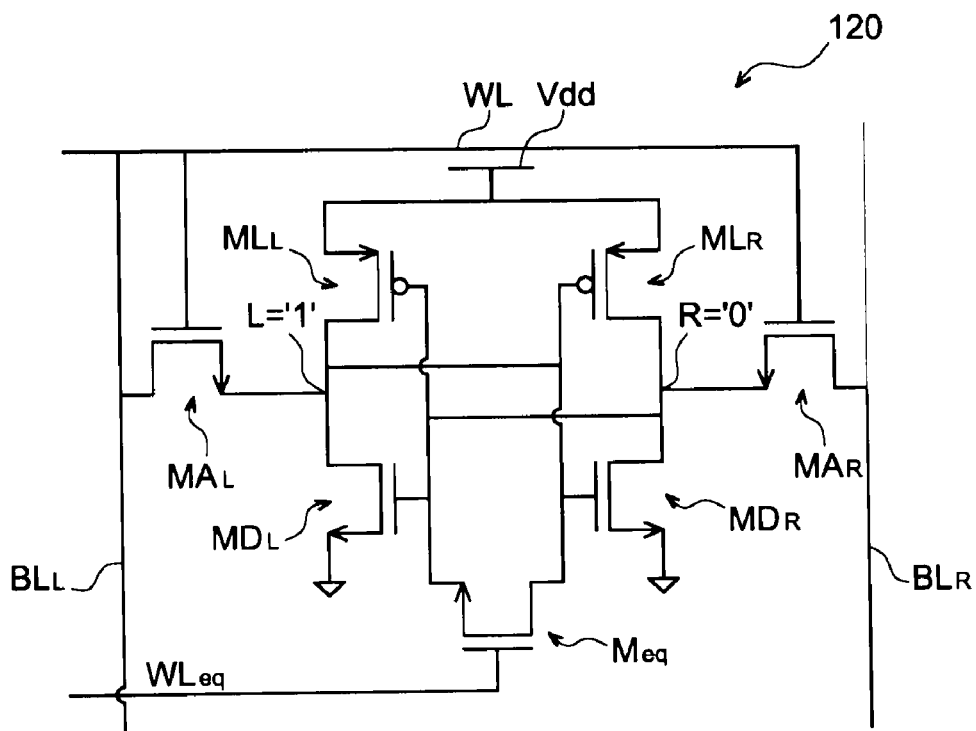
FIG. 3, illustrates an example of a prior art memory cell with 7 transistors, provided with an additional equilibration transistor.
Figure 4:
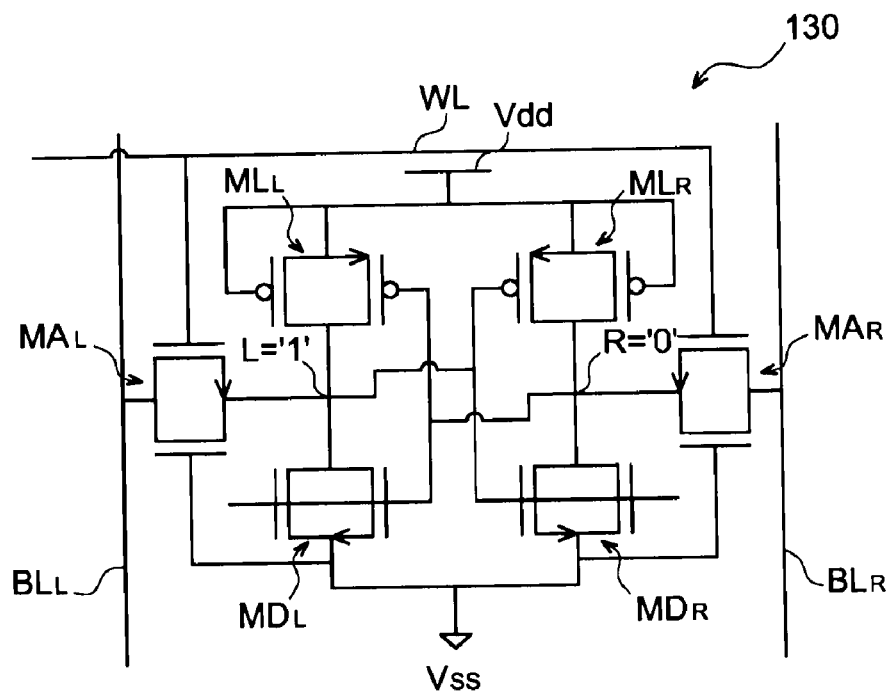
FIG. 4, illustrates a second example of a prior art memory cell with 6 double gate transistors.
Figure 5:
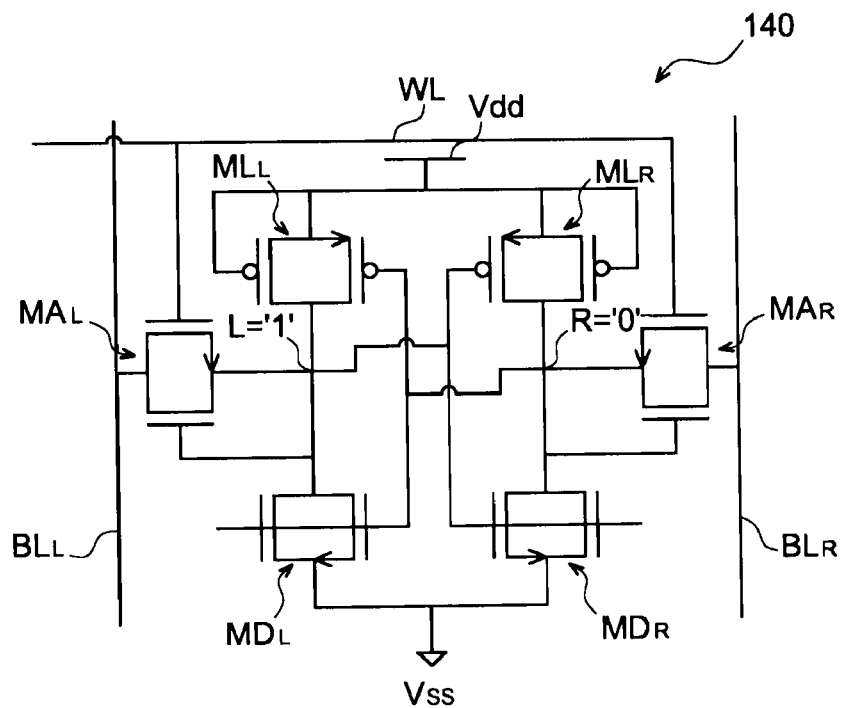
FIG. 5, illustrates a third example of a prior art memory cell comprising 6 double gate transistors.
Figure 6:
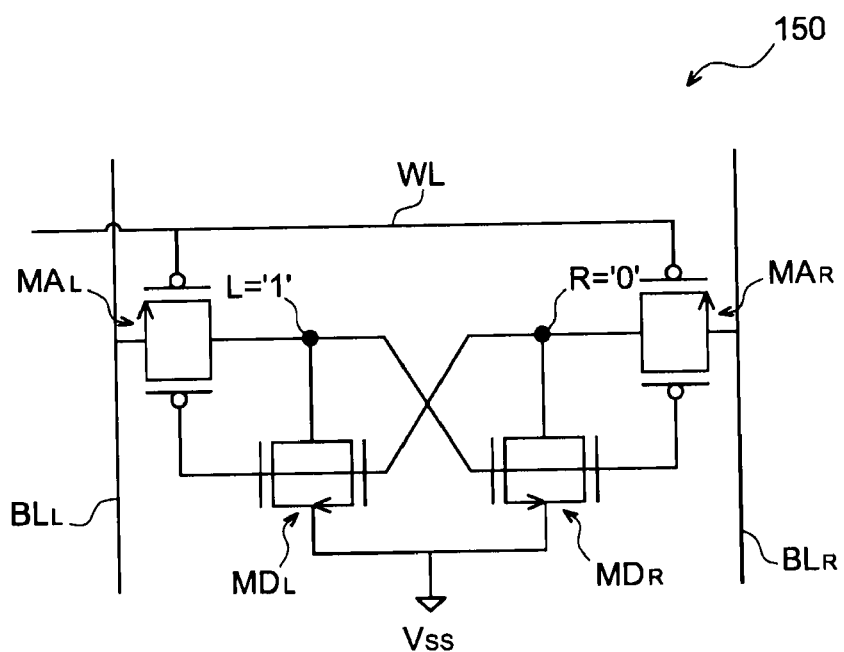
FIG. 6, illustrates a prior art memory cell, provided with 4 double gate transistors.
Figure 7:
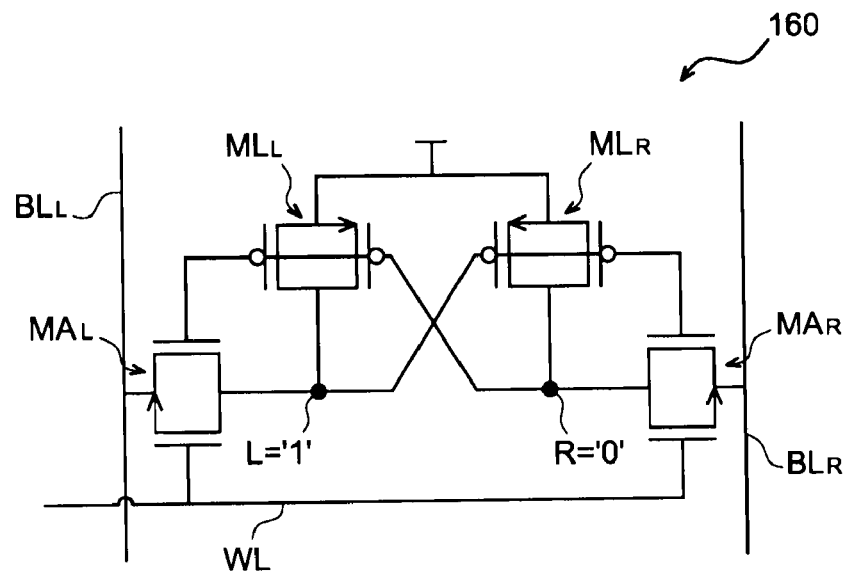
FIG. 7, illustrates another example of a prior art memory cell comprising 4 double gate transistors.
Figure 8:
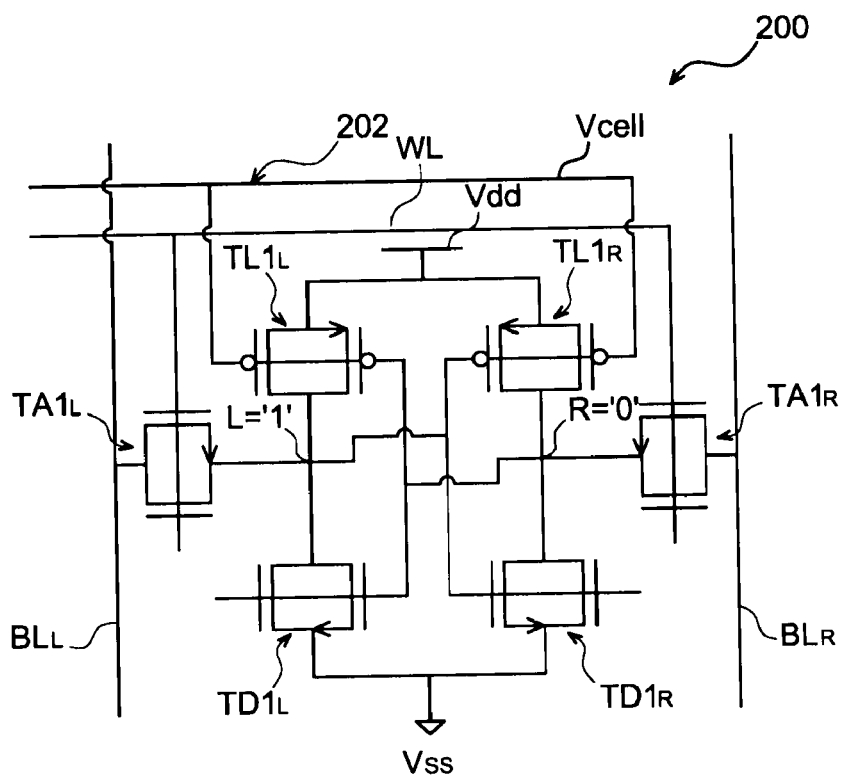
FIG. 8, illustrates an example of a memory cell, provided with 6 double gate transistors and an additional polarization line connected to a gate electrode of the load transistors.

FIG. 8 gives an example of cell 200, with transistors (or <<6T>> cell) of a memory of SRAM type. The cell 200 is formed of transistors fabricated using MOS technology (Metal Oxide Semi-conductor) and with double gate.

The cell 200 is provided with a first access transistor $TA1_L$ with double gate, and a second access transistor $TA1_R$ with double gate, which can be fabricated using a first given type of MOS technology, for example NMOS technology.

The first access transistor $TA1_L$ depending on the manner in which it is polarized, is designed to allow access or to block access to a first storage node L intended to hold given logic data, for example logic '1'. The second access transistor $TA1_R$ depending on the manner in which it is polarized, is designed to allow access or to block access to a second storage node R intended to hold logic data complementing said given logic data, for example logic '0'.

In this example, the two gates of the first access transistor $TA1_L$ and of the second access transistor $TA1_R$ are connected to a word line WL. In other words, the access transistors $TA1_L$ and $TA1_R$ each comprise two gate electrodes connected together and to the word line WL.

The word line WL is intended to convey a polarization potential. The word line WL is intended to be polarized differently, depending on the operating phase in which the cell is placed or on the operating mode in which cell 200 is placed i.e. depending on whether this cell 200 is in data read mode or data write mode, or in a data retention mode i.e. a mode during which data remains memorized in cell 200 without there being any access to this data.

A drain/source electrode of the first access $TA1_L$ and a drain/source electrode of the second access transistor $TA1_R$ are respectively connected to a first bit line $BL_L$ and a second bit line $BL_R$. The bit lines $BL_L$ and $BL_R$ are designed to transmit data to be written in the cell or data to be read in cell 200.

Cell 200 also comprises a first load transistor with double gate $TL1_L$, and a second load transistor with double gate $TL1_R$. The load transistors $TL1_L$ and $TL1_R$, can be fabricated using a second type of given MOS technology, complementing the first type e.g. technology of PMOS type. The sources of the load transistors $TL1_L$, $TL1_R$ are connected together and to a potential VDD. The potential VDD, for example, may be in the order of 1V volt for gates of critical dimension in the order of 45 nanometres. The potential VDD may be adapted to the envisaged application of cell 200.

One gate electrode of the first load transistor with double gate $TL1_1$, is connected to a specific polarization line 202 designed to convey a polarization potential VCELL. One gate electrode of the second load transistor $TL2_R$ is also connected to the said specific polarization, line 202. The polarization potential VCELL is able to vary in relation to the operating mode in which the cell is placed.

The cell 200 also comprises a first driver transistor with double gate $TD1_L$, and a second driver transistor with double gate $TD1_R$. The driver transistors $TD1_1$, and $TD1_R$, can be fabricated using a type of MOS technology complementing said second type, for example NMOS technology. The two gates of the first driver transistor $TD1_1$, are connected together, and the two gates of the second driver transistor $TD1_R$ are also connected together. The two gates of the first driver transistor $TD1_L$ are also connected to the second storage node R, whilst the two gates of the second driver transistor $TD1_R$ are connected to the first storage node L of cell 200. The sources of the driver transistors $TD1_L$, $TD1_R$ are connected together and to a reference potential VSS. The reference potential VSS may be in the order of 0 Volt for example. The reference potential may be adapted to the intended application of the cell 200. The drain of the second driver transistor $TD1_R$ and the drain of the first driver transistor $TD1_1$, are respectively connected to the second storage node R of cell 200 and to the first storage node L of cell 200.

The load transistors $TL1_L$, $TL1_R$ and driver transistors $TD1_L$, $TD1_R$ form a flip-flop for the cell 200, and are designed to control and hold data kept by the storage nodes L, R.

The first storage node L, may be intended to hold given logic data for example logic '1', whilst the second storage node R is intended to hold complementary logic data of logic data, for example logic '0'.

The connecting of a gate electrode of the load transistors $TL1_1$, and $TL1_R$ to the additional polarization line 202, and the placing of this gate electrode at an adapted potential VCELL during a write operation, allows an improved write margin to be obtained compared with a conventional 6T cell.

According to one operating principle of this cell 200, means are employed which, during a write operation, can reduce the drive current of the first load transistor $TL1_L$ whose drain is connected to the storage node intended to hold logic '1' data, for example the first node L, to facilitate discharge towards said node during a write cycle.

For this purpose, a gate electrode of the first load transistor $TL1_L$ can be polarized at potential VCELL delivered by the additional polarization line 202, in which VCELL=VDD+ σV, during a write operation with σV being a non-zero voltage.

The voltage σV can be such that 0<σV<VGS_breakdown_oxide, with Vgs_breakdown_oxide being an evaluation of the breakdown voltage of the gate dielectric of the gate electrode which is connected to the polarization line 202. This can allow an increase in the threshold voltage of the first load transistor $TL1_1$, via reverse bias effect of one of the gate electrodes, for example of the back gate at potential $V_{BG}$ relative to the source potential $V_S$ of the transistor ($V_{BGS}=V_{BG}-V_S>0$) connected to potential VDD or, for example, of the front gate at potential $V_{FG}$ relative to potential $V_S$ of the transistor source, ($V_{FGS}=V_{FG}-V_S>0$) which is connected to potential VDD.

In retention mode, it is also possible to apply a potential VCELL delivered by the additional polarization line 202. The potential VCELL applied in retention mode may be identical to the potential applied in write mode, with VCELL=VDD+ σV which can reduce the leakage currents of the cell 200. The second load transistor TL$_R$ which is connected to the storage node of logic level '0' has its threshold voltage increased which therefore limits its below-threshold current.

The potential VCELL applied by the additional polarization line 202 is able to be modified or may vary in relation to the operating phase in which the cell 200 lies.

In read operating mode, the potential VCELL may be placed for example at a value VDD, to promote the maintaining of logic level '1' at the first node and to obtain SNM read stability equivalent to that of a standard 6-transistor cell.

Means to cause a variation in the potential VCELL applied by the additional polarization line 202 are therefore used. These means are designed to adapt the VCELL potential in relation to the operating mode in which the cell is placed. The potential VCELL is intended to vary depending on whether this cell is in read, write or retention phase. VCELL=VDD+ σV may be generated using a level shifter for example.

Figure 9A:
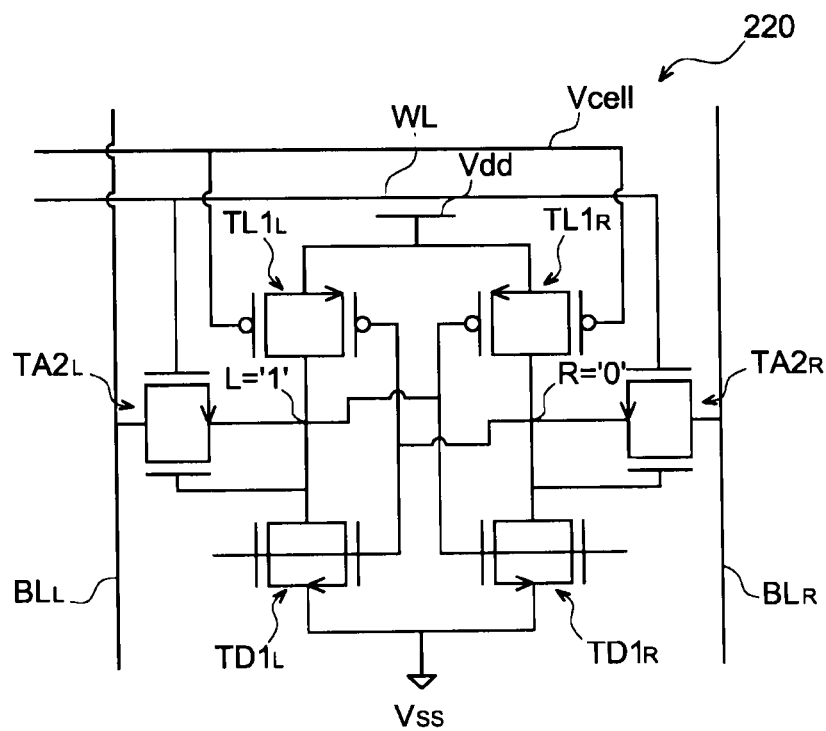
FIGS. 9A-9B, illustrate another example of a memory cell provided with 6 double gate transistors and an additional polarization line connected to a gate electrode of the load transistors.

In FIG. 9A, another example of a 6T SRAM memory cell 220 is given. This cell 220 is an improvement on the one (referenced 200) described previously in connection with FIG. 8. The cell 220 differs from the one described previously with reference to FIG. 8 notably through the arrangement of its access transistors referenced TA2$_L$ and TA2$_R$.

The first access transistor TA2$_L$ and the second access transistor TA2$_R$ of cell 220 each comprise a first gate electrode connected to the word line WL. The first access transistor TA2$_L$ comprises a second gate electrode connected to the drain of the first driver transistor TD1$_L$ and of the first load transistor TL1$_L$, whilst the second access transistor TA2$_R$ also comprises a second gate electrode connected to the drain of the second driver transistor TD1$_L$ and of the second load transistor TL1$_L$. With said configuration, compared with the example of embodiment in FIG. 8, it is possible to obtain an improvement in SNM on account of the reduction in the drive current of the access transistors.

Figure 9B:
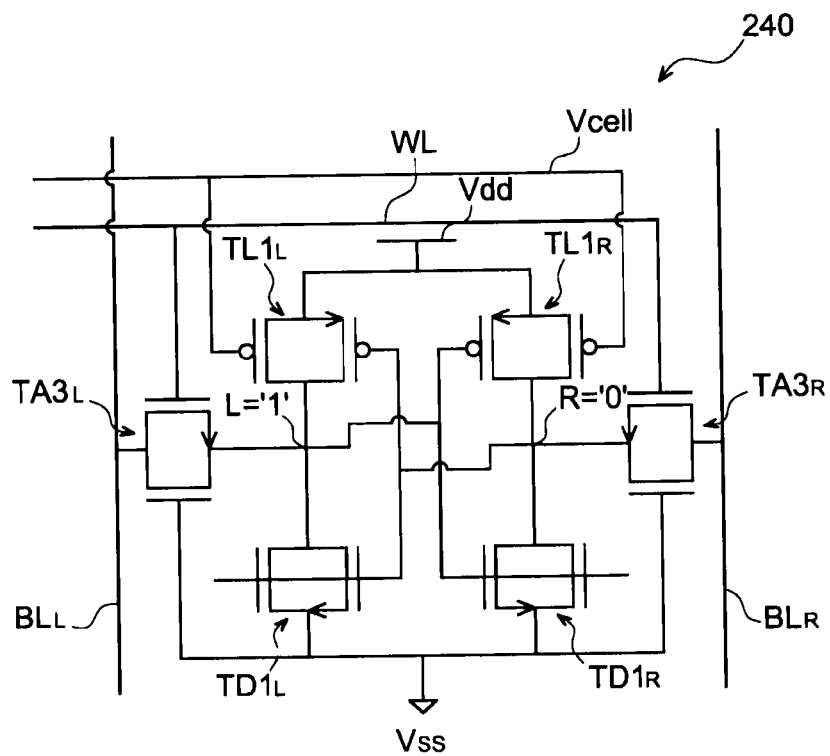

In FIG. 9B, another example of a 6T SRAM memory cell 240 is given. This cell 240 differs from the one (referenced 200) described previously in connection with FIG. 8, notably through the arrangement of its access transistors referenced TA3$_L$ and TA3$_R$. The first access transistor TA3$_L$ and the second access transistor TA3$_R$ of the cell 220 each comprise a first gate electrode connected to the word line WL. The first access transistor TA3$_L$ also comprises a second gate electrode connected to the source of the first driver transistor TD1$_L$, whilst the second access transistor TA3$_R$ also comprises a second gate electrode connected to the source of the second driver transistor TD1$_R$.

With said configuration, it is possible to obtain a write margin that is even further improved compared with the cell in the example shown FIG. 9A.

For the cells just described in connection with FIGS. 8, 9A, 9B, the generating of the potential VCELL in write mode may require the implementation of at least one additional circuit of <<level shifter>> type such as described in the document by K. Itoh, VLSI Memory Chip Design, Springer-Verlag, pp. 87-88, 2001 and K. Itoh, VLSI Memory Design, Baifukan, Tokyo, 1994.

In the examples which have just been given the voltage VCELL, in particular in write mode, is limited by the difference in voltage between the gate and the drain of the load transistor which is connected to the storage node of logic level '0', this difference having to be lower than the breakdown voltage Vgs_breakdown_oxide of the gate dielectric of the gate connected to line 202. Vgs_breakdown_oxide may be such for example that Vgs_breakdown_oxide=Vdd+300 mV.

In the examples of cells just given, it therefore appears that the voltage VCELL is limited by the breakdown voltage of the gate dielectric of the load transistors.

Examples of SRAM memory cells according to the invention will now be given. To overcome the problem of VCELL voltage limitation by the breakdown voltage of the gate dielectric of the load transistors, one solution consists of applying a voltage VCELL to an electrode other than the gate electrodes of the load transistors. For example, a VCELL voltage may be applied, using an additional polarization line 302, to the source of the load transistors of the cell.

Figure 10:
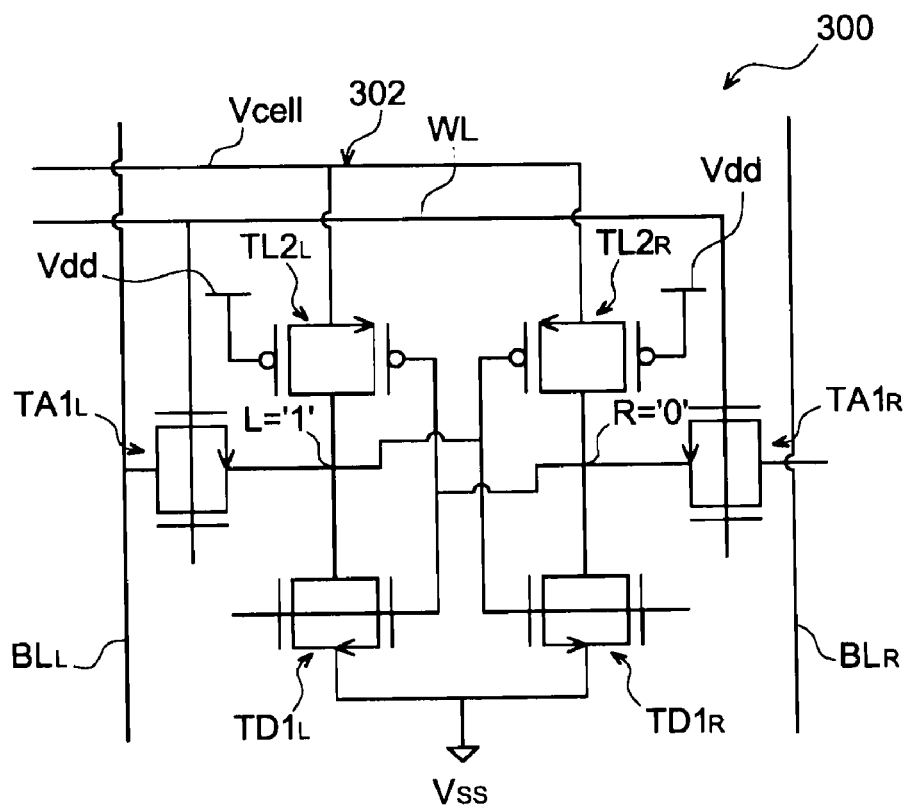
FIG. 10, illustrates an example of a memory cell according to the invention, with 6 double gate transistors and provided with an additional polarization line connected to a source electrode of the load transistors, to apply a voltage VCELL intended to vary in relation to the operation mode in which the cell in placed.

FIG. 10 gives an example of a cell 300 according to the invention, with 6 transistors (or <<6T>>) and belonging to a memory of SRAM type.

The cell 300 differs from the examples of cells 200, 220 and 240 previously described in connection with FIG. 8, notably through the arrangement of its load transistors TL2$_L$ and TL2$_R$.

The load transistors TL2$_L$ and TL2$_R$ of the cell 300 each have a first gate electrode connected to a potential VDD. The first load transistor TL2$_L$ of the cell 300 has a second gate electrode connected to the second storage node and to a gate electrode of the first driver transistor TD1$_L$, whilst the second load transistor TL2$_R$ has a second gate electrode connected to the first storage node and to a gate electrode of the second driver transistor TD1$_R$.

The source of each of the load transistors TL2$_L$ and TL2$_R$ of the cell 300 is connected to a specific polarization line 302 allowing the conveying of the potential VCELL.

According to one operating principle of this cell 300, a reduction in the drive current of the load transistors in write mode is applied to facilitate the discharge of the storage node at logic level '1'.

For this purpose, in write mode, a potential VCELL is applied on the polarization line 302, such that VCELL=VDD−σV, in which σV is a voltage such that σV>0 volt. The voltage σV may, for example, be such that: VDD>σV>VRET in which VDD is the supply voltage to which the first gate electrode of the load transistors is connected, and VRET is the minimum voltage of the cell in retention mode. The voltage VRET may be determined statistically for example using Monte-Carlo simulations. The voltage VRET may be determined in such manner, for example, that the mean retention noise margin (RNM) divided by its standard deviation is greater than 6 for example. The voltage VCELL, applied in write mode, may be designed in relation to the minimum voltage VRET of the cell in retention mode, in order to guarantee sufficient stability. The given potential VCELL applied during write phases of the cell, in this example of embodiment, is designed to be different from the supply voltage Vdd and so as to produce a drive current of the load transistors that is smaller than when the given potential VCELL and the supply voltage Vdd are equal, as may be the case in this example during read phases.

According to one possibility, in data retention mode, it is also possible to apply a potential VCELL on the polarization line 302 that is similar to the one applied in write mode. Therefore, in retention mode, it is also possible to apply a potential VCELL, such that VCELL=VDD−σV, in which σV is a voltage such that σV>0 volt, to reduce leakage currents of the cell, σV possibly being such for example that: VDD>σV>VRET.

Compared with the static consumption of the examples of cells described in connection with FIGS. 8, 9A, and 9B, the consumption of cell 300 is further reduced. With said arrangement of the polarization line 302 relative to the sources of the load transistors, it is possible to reduce leakage currents in both inverters of the cell. A reduction in the current below the threshold of the second load transistor $TL2_R$ connected to the second storage node R of logic level '0' and a reduction in the leakage currents of the first driver transistor $TD2_L$ connected to the first storage node L at logic level '1' can be implemented.

In read mode, the voltage VCELL may be different from the voltage applied during retention and write modes, such that VCELL=VDD can be applied. This may promote holding of the logic level '1'.

Figure 11A:
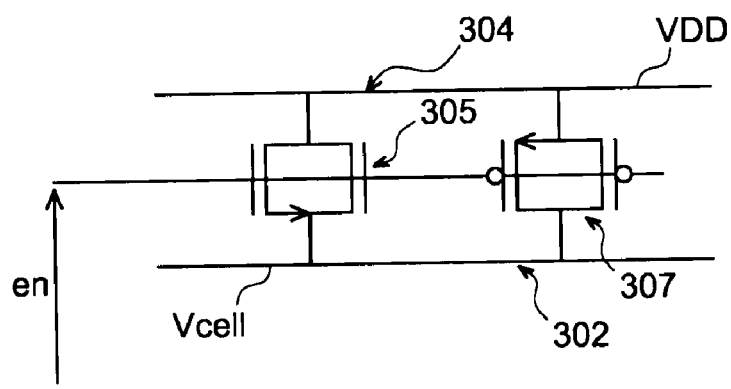
FIGS. 11A and 11B, illustrate examples of means to produce said voltage VCELL and to apply this voltage to said additional polarization line of the cell in FIG. 10, FIGS. 12A-12B, illustrate other examples of memory cells according to the invention, with 6 double gate transistors and provided with said additional polarization line connected to a source electrode of the load transistors.

FIG. 11A gives an example of an embodiment of means to produce the voltage VCELL and to apply this voltage to the additional polarization line in relation to the mode in which cell 300 is placed.

The means to apply the voltage VCELL may receive an input voltage En, also intended to assume several statuses or values, in relation to the mode in which the cell 300 is placed. The signal En may be generated by a control block of the memory circuit.

The means to apply the voltage VCELL may be formed of two transistors 305, 307 of a type complementing the double gate transistor 305 and located between a polarization line which may be placed at potential VDD, and the additional polarization line 302. A first double-gate transistor 305 has one drain connected to the polarization line 304 and one source connected to the additional polarization line 302. A second double gate transistor 307 has one source connected to the polarization line 304 and one drain connected to the additional polarization line 302. The two gate electrodes of the transistor 305 are connected together and to those of transistor 307. The input signal En is applied to the double gates of transistors 305, 307.

For En=VSS, we have VCELL=VDD since the transistor 307 is enabled, transistor 305 being disenabled.

For En=VDD, we have VCELL=VDD−VTN (VTN=threshold voltage of the NMOS transistor) since the PMOS transistor is disenabled and the NMOS transistor is enabled.

In read mode, the input voltage En may assume a first status or first value, for example such that En=0 V, which places the additional polarization line 302 at potential VDD, so that VCELL=VDD.

In write mode, the signal En may assume a second status or second value, and may for example be such that En=VDD, which places the additional polarization line 302 at VCELL=VDD−VTN, in which VTN is the threshold voltage of transistor 305. In this case, we have σV=VTN.

It is also possible to provide that σV=k*VTN in which k>1, for example by providing several stacked NMOS transistors instead of the transistor 305.

Figure 11B:
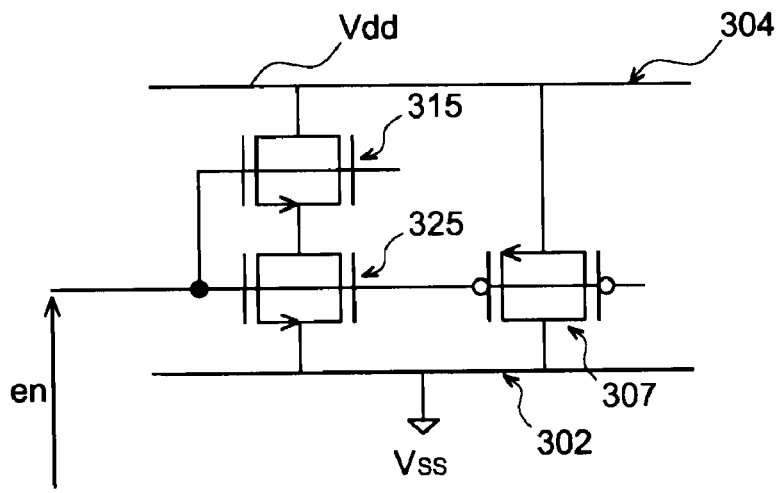

FIG. 11B gives an example of embodiment in which k=2 stacked transistors 315 and 325. In read mode, the input voltage En may assume a first status or first value, and for example may be such that En=0 V, which places the additional polarization line 302 at potential VDD, so that VCELL=VDD.

In write mode, the signal En may assume a second status or second value, and for example maybe such that En=VDD, which places the additional polarization line 302 at VCELL=VDD−2*VTN, in which VTN is the threshold voltage of the transistor 305. In this configuration, we have σV=2*VTN.

In this example of embodiment, the voltage VCELL applied to the source of the load transistors is advantageously lower than the potential VDD. In terms of consumption, this cell is therefore better than the one in the example shown FIG. 8.

This may also make it possible to avoid the use of circuits of level shifter type and thereby obtain savings in space.

The means to apply the voltage VCELL are not limited to the examples of embodiment just given.

Figure 16:
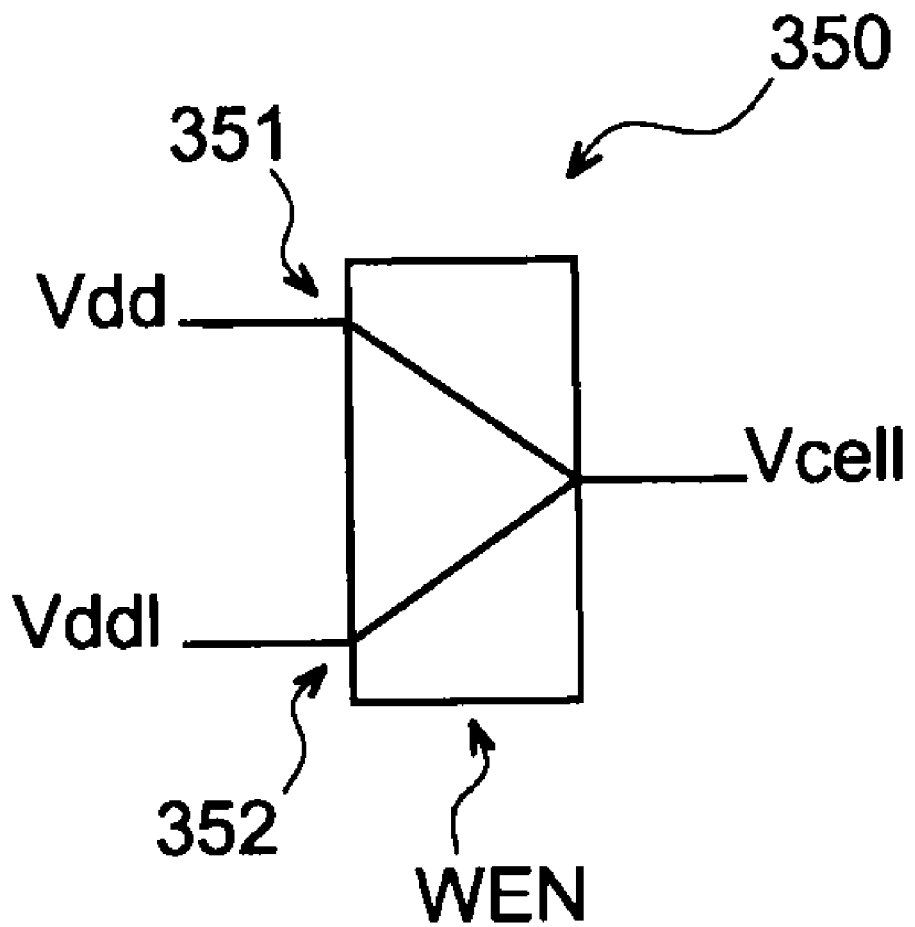
FIG. 16, illustrates another example of means provided to produce said voltage VCELL and to apply this voltage to said additional polarization line of the cell in FIG. 10.

FIG. 16 gives another example of means to apply the potential VCELL. These means comprise switching means 350 which, on a first input 351, receive a first supply voltage VDD from the memory circuit, for example of 1.2 volt and, on a second input 352, receive a second supply voltage VDDL from the memory circuit which is lower than VDD, and is 0.9 volt for example.

Depending on the status of a signal WEN, it is the first input 352 or the second input 354 which is output from the switching means 350.

In read mode, the signal WEN may assume a first status, the output of the switching means 350 then being such that the additional polarization line 302 is at potential VDD, so that VCELL=VDD.

In write mode, the signal WEN may assume a second status, the output of the switching means 350 then being such that the additional polarization line 302 is at potential VDDL, so that VCELL=VDD−σV=VDDL.

Therefore the potential VCELL applied during write phases of the cell, in this example of embodiment, is designed to differ from the reference potential Vdd and so as to produce a lower drive current of the load or driver transistors than when the given potential VCELL and the reference potential are equal.

Figure 12A:
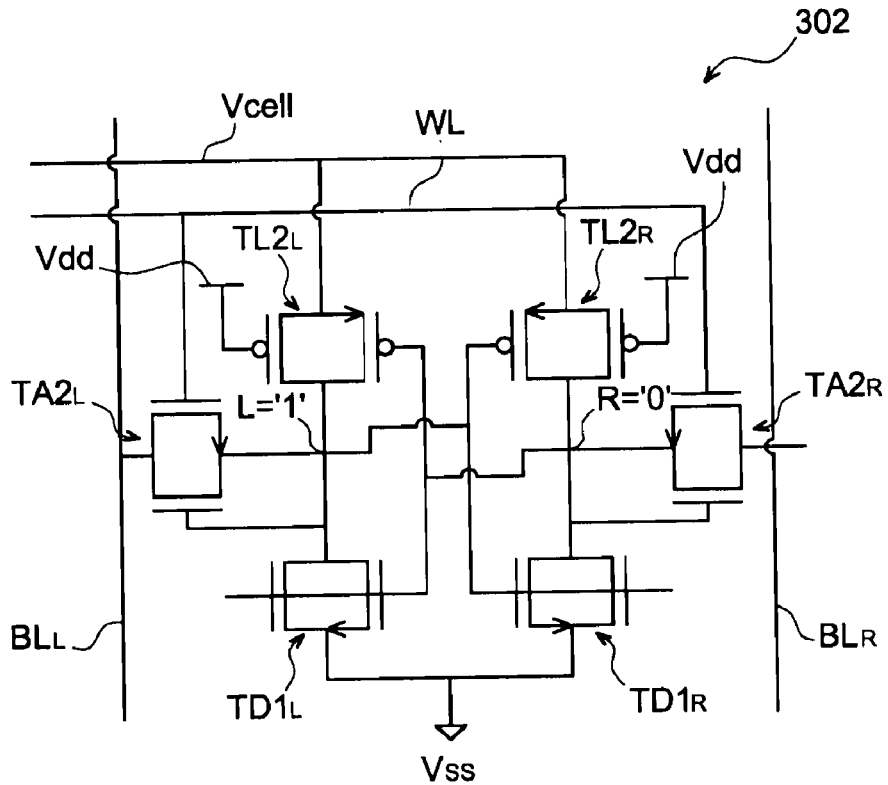

FIG. 12A gives another example of the cell 320. The cell 320 differs from the cell previously described in connection with FIG. 10, notably through the arrangement of its access transistors referenced $TA2_L$ and $TA2_R$.

The first access transistor $TA2_L$ and the second access transistor $TA2_R$ of the cell 220 each comprise a first gate electrode connected to the word line WL. The first access transistor $TA2_L$ also comprises a second gate electrode connected to the drain of the first driver transistor $TD1_L$ and of the first load transistor $TL2_L$. The second access transistor $TA2_R$ also comprises a second gate electrode connected to the drain of the second driver transistor $TD1_R$ and of the second load transistor $TL2_R$.

Figure 12B:
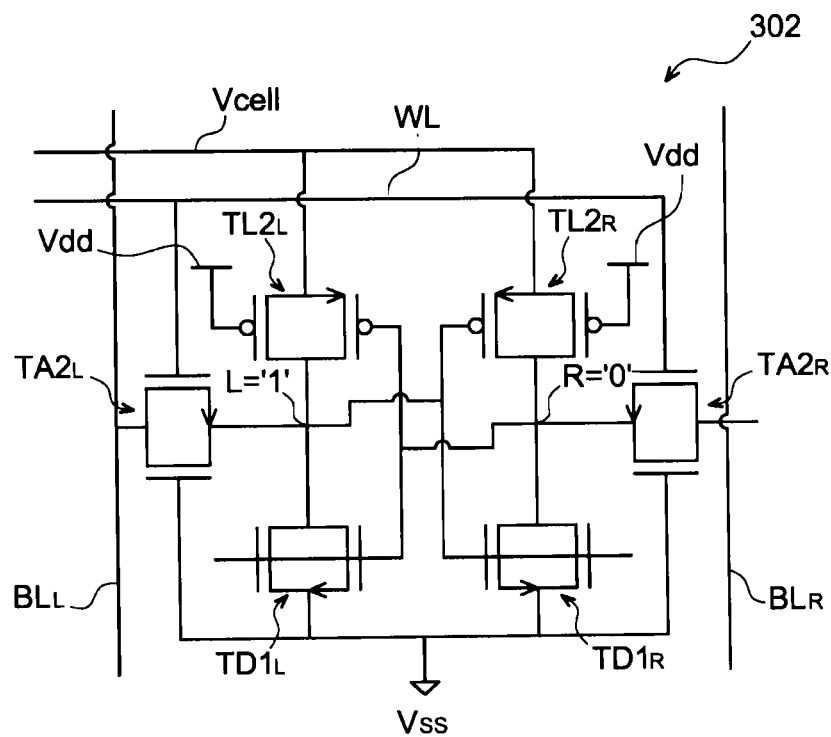

FIG. 12B gives another example of a cell 340. The cell 340 differs from the cell described previously in connection with FIG. 10, notably through the arrangement of its access transistors $TA3_L$ and $TA3_R$. The first access transistor $TA3_L$ comprises a gate electrode connected to the source of the first driver transistor $TD1_L$, whilst the second access transistor $TA3_R$ comprises a gate electrode connected to the source of the second driver transistor $TD1_R$.

According to another possible embodiment, it is possible to modify the polarization of the load transistors of the cell by applying a potential VCELL to them, intended to vary in relation to the operating mode in which this cell lies, i.e. depending on whether it is in retention, read or write mode, whilst avoiding the need for an additional polarization line. Compared with conventional cells, it is therefore possible to improve the write margin whilst maintaining identical or similar cell volume.

For this purpose, the load transistors may each comprise at least one electrode connected to the word line WL. In this other possible embodiment, the voltage VCELL is applied to the load transistors using the word line WL in relation to the mode in which the cell 300 is placed.

Figure 13:
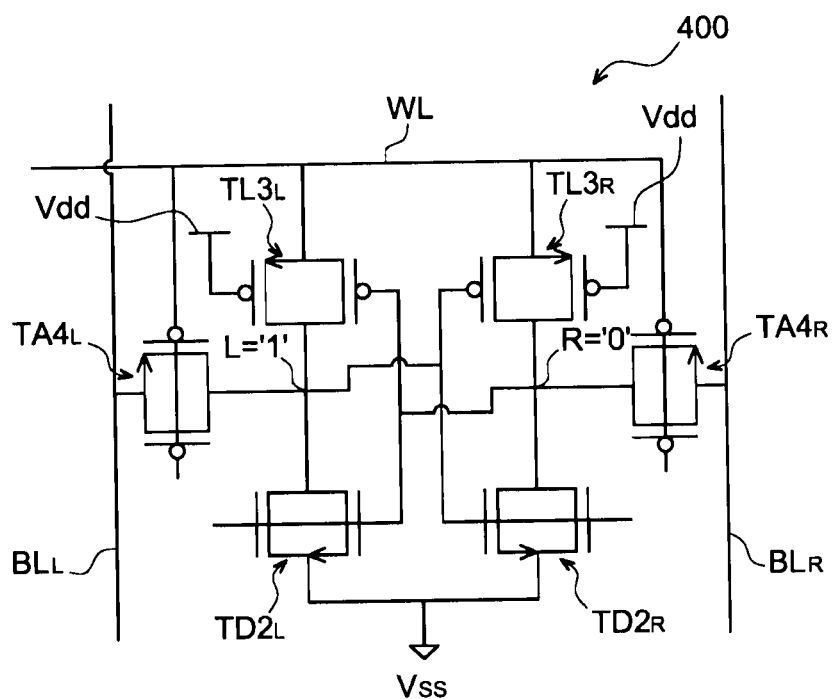
FIG. 13, illustrates another example of a memory cell according to the invention with 6 double gate transistors and whose word line is designed to apply a potential VCELL to the source of the load transistors, VCELL being intended to vary in relation to the operating mode in which the cell is placed.

FIG. 13 illustrates another example of a cell 400 according to this other possible embodiment.

The cell 400 differs from the one (referenced 300) previously described in connection with FIG. 10, notably through its access transistors TA4$_L$ and TA4$_R$, which are fabricated using technology complementing the technology used for the driver transistors of the cell 300. The access transistors TA4$_L$ and TA4$_R$ of the cell 400 can be fabricated using PMOS technology. The access transistors TA4$_L$, TA4$_R$ of the cell 400 have their gate electrodes connected to the word line WL.

The cell 400 also differs from the one (referenced 300) previously described in connection with FIG. 10, through the arrangement of its load transistors TL3$_L$, TL3$_R$. The load transistors TL3$_L$, TL3$_R$ of the cell 400 have their source connected to the word line WL.

The polarization of the word line WL in retention mode may be such that the access transistors TA3$_L$ and TA3$_R$ are disenabled. In retention mode, the word line WL may be held at potential VCELL=VDD. The source of the load transistors TL3$_L$, TL3$_R$ is therefore placed at potential VDD.

In read and write modes, the word line WL may be polarized at a potential VCELL lower than VDD, for example at a potential VSS in the order of 0V.

In read and write modes, the access transistors are enabled and the first load transistor TL3$_L$ connected to the first storage node L of logic level '1' is no longer conductive or becomes less conductive. This results in improved write operations.

The given potential VCELL applied during write phases of the cell, in this example of embodiment, is designed to be lower than the potential VDD so as to produce a drive current of the load transistors that is lower than when the given potential VCELL and the reference potential Vdd are equal.

Figure 14:
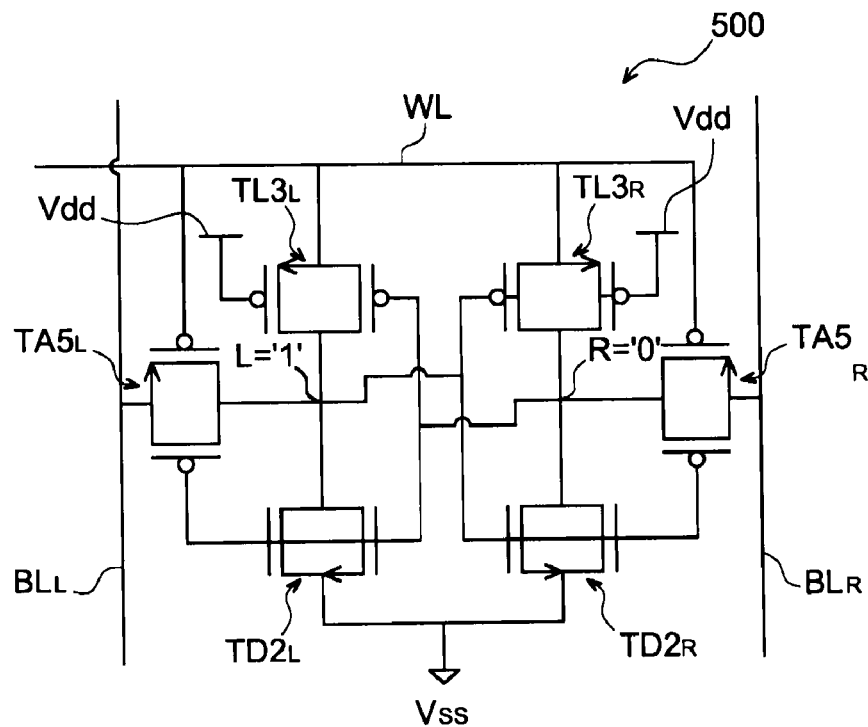
FIG. 14, illustrates another example of a memory cell according to the invention with 6 double gate transistors and whose word line is designed to apply a potential VCELL to the source of the load transistors, VCELL being intended to vary in relation to the operating mode in which the cell is placed.

FIG. 14 illustrates another example of a cell 500 with 6 transistors (or <<6T>>) of a memory cell of SRAM type. The cell 500 differs from the cell (referenced 400) previously described in connection with FIG. 13, through the arrangement of its access transistors TA5$_L$ and TA5$_R$.

A first gate electrode of the first access double gate transistor TA5$_L$ is connected to the word line WL, whilst a first gate electrode of the second double gate access transistor TA5$_R$ is also connected to the word line WL.

The first access transistor TA4$_L$, which allows or blocks access to the first storage node L, comprises a second gate electrode connected to the second node R. The second access transistor, which allows or block access to the second node R, comprises a second gate electrode connected to the first node L.

The second gate electrode of the first access transistor TA5$_L$ of the cell 500 can be connected to the gate electrodes of the first driver transistor TD2$_L$, whilst the second gate electrode of the second access transistor TA5$_R$ of the cell 500 can also be connected to the gate electrodes of the second driver transistor TD2$_R$.

With said configuration it is possible to obtain improved read stability. The implementing of said feedback can limit the drive current of the access transistor connected to the second storage node R of logic level '0'.

To limit leakage currents, the access transistors TA5$_L$ and TA5$_R$ may have asymmetrical double gates, for example by providing dielectric layers of different thicknesses for the double gate.

Figure 15:
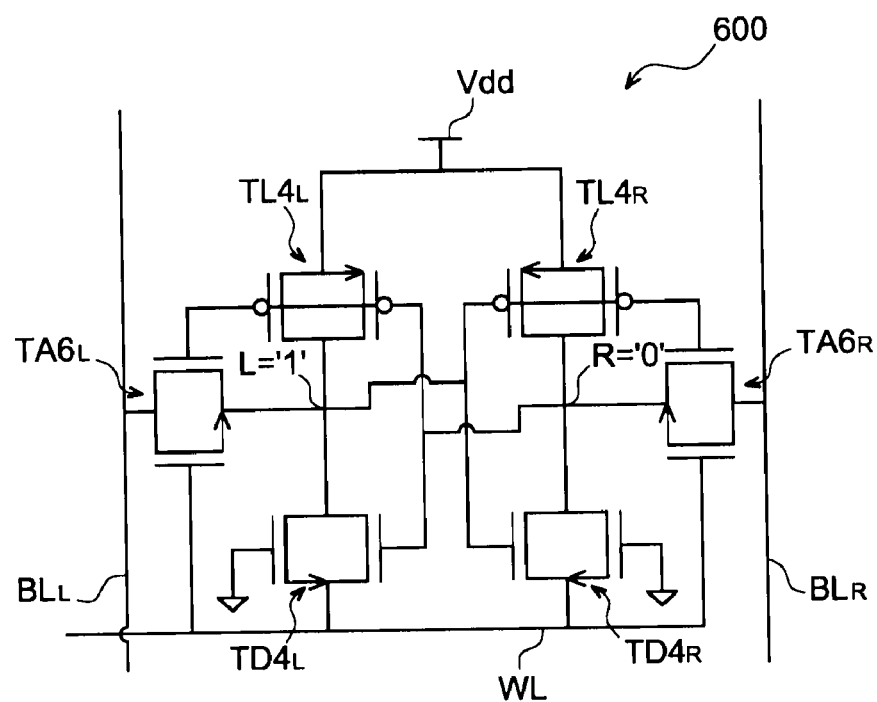
FIG. 15, illustrates another example of a memory cell according to the invention with 6 double gate transistors and whose word line is designed to apply a potential VCELL to the source of the driver transistors, VCELL being intended to vary in relation to the operating mode in which the cell is placed.

FIG. 15 illustrates another example of a cell 600, with 6 transistors (or <<6T>>) of a memory of SRAM type.

The cell 600 is provided with a first double gate access transistor TA6L and with a second double gate access transistor TA6$_R$ which may be fabricated using a first type of given MOS technology e.g. of NMOS type. The first access transistor TA6$_L$ is positioned between a first bit line BL$_L$ and a first storage node L, whilst the second access transistor TA5$_R$ is positioned between a second bit line BL$_R$ and a second storage node R.

In this example, the first access transistor TA6$_L$ and the second access transistor TA6$_R$ comprise a gate electrode connected to a word line WL. The first access transistor TA6$_L$ comprises another gate electrode connected to the gate of a first load transistor TL4$_L$. The second access transistor TA6$_R$ also comprises another gate electrode connected to the gate of a second load transistor TL4$_R$.

The load transistors TL4$_L$ and TL4$_R$, can be fabricated using a given type of MOS technology, complementing the technology used for the access transistors, for example technology of PMOS type. The load transistors TL4$_L$ and TL4$_R$ have a source connected to a supply voltage VDD. The gate electrodes of the first load transistor TL4$_L$ are connected together, whilst the gate electrodes of the second load transistor TL4$_R$ are also connected together.

The first load transistor TL4$_L$ has one drain connected to the drain of a first driver transistor TD4$_L$. The second load transistor TL4$_R$ has a drain connected to the drain of a second driver transistor TD4$_R$. The first driver transistor TD4$_L$ comprises a source connected to the word line WL, whilst the second driver transistor TD4$_R$ comprises a source also connected to the word line WL. Therefore, in this example, it is the driver transistors TD4$_L$ and TD4$_R$ whose polarization status is caused to vary, via a potential VCELL applied to the word line WL, depending on the operating mode in which the cell 600 is placed.

The driver transistors TD4$_L$, TD4$_R$ each comprise a gate electrode connected to ground or to a reference potential VSS.

The given potential VCELL applied during write phases of the cell 600, is designed to be different from the reference potential Vss and so as to produce a lower drive current of the driver transistors during write phases, in particular lower than when the given potential VCELL and the reference potential Vss are equal.

Another gate electrode of the first driver transistor TD4$_L$ is connected to the gate electrodes of the first load transistor TL4$_L$, whilst a gate electrode of the second driver transistor TD4$_R$ is connected to the gate electrodes of the second load transistor TL4$_R$.

In retention mode, the word line WL can be placed at 0 V, to block the access transistors.

In read mode, the word line WL can be placed at a potential greater than 0 V, for example at potential VDD.

In write mode, the word line WL can be placed at a potential greater than 0 V, for example at potential VDD.

To limit leakage currents, asymmetrical double-gate access transistors can be used. Asymmetrical double-gate access transistors can be fabricated using a thicker gate dielectric for one gate electrode than for the gate electrode of the other gate electrode.

A comparison of the electric characteristics of examples of 6T-type cells produced according to the invention, with those of a prior art cell, so-called <<standard 6T>> cell, will now be given with reference to the table below.

The standard 6T cell was sized so as to have low surface area occupancy and read stability equal to or greater than 200 mV.

For this comparison, the transistors of the other cells were sized with the same gate lengths and widths for an accurate evaluation of the contribution made by the proposed architectures.

Table 1 gives the chosen sizing of the load transistors TL, access transistors TA and driver transistors TD, the minimum gate length and width respectively being 50 nm and 100 nm.

TABLE 1

Dimensions of memory points

| (W/L)$_{TL}$ (nm) | (W/L)$_{T4}$ (nm) | (W/L)$_{TD}$ (nm) |
|---|---|---|
| 100/50 | 100/70 | 300/50 |

Table 2 below gives the simulation results obtained using ELDO software and VerilogA implemented model (such as presented in M. Reyboz et al., "Explicit Threshold Voltage Based Compact Model Of Independent Double Gate (IDG) MOSFET Including Short Channel Effects", CEA, Grenoble) of a standard 6T cell, and of cells such as cells 200, 300, 400, 500 described previously. The cells are similarly sized.

TABLE 2

Electric characteristics

| Criteria | standard 6T | Cell 200 | Cell 300 | Cell 400 | Cell 500 |
|---|---|---|---|---|---|
| Read stability (SNM) (mV) | 203 | 162 | 162 | 264 | 346 |
| Retention (mV) | 349 | 320 | 212 | 329 | 377 |
| I$_{LEAK}$ (nA) | 1.89 | 1.63 | 0.83 | 1.86 | 1.87 |
| Write margin (mV) | 847 | 647 | 573 | 579 | 639 |

Cell 200 has an improved write margin in the order of 24% compared with the standard 6T cell, and improved static consumption of about 14%. The stability of said cell 200 can be improved by optimizing the sizing of its transistors or by applying feedback such as explained for the cells described with reference to FIGS. 9A and 9B.

Cell 300 has an improved write margin in the order of 32%, with a reduction in static consumption in the order of 56% (reduced supply voltage of 300 mV) compared with a standard 6T cell. The stability of said cell 300 can be improved by optimizing the sizing of its transistors or by applying feedback as for the cells described in connection with FIGS. 12A and 12B.

Cell 400 has an improved write margin and improved read stability of more than 30% for equivalent consumption, as compared with a standard 6T cell.

By comparison with a standard 6T cell, the cell 500 has an improved write margin in the order of 25% and is characterized by a marked increase in its read stability with a gain of 70%. Retention stability is also improved by 8%.

Globally, the cells described above allow an improvement in the compromise between write margin and read stability.

CITED DOCUMENTS

[1]: Z. Guo, S. Balasubramanian, R. Ziatanovici, T-J. King and B. Nikoli'c, "FinFET-Based SRAM Design", UC Berkeley, ISLPED, San Diego, Calif., USA, 2005.

[2]: J.-S. Wang et al. "Current-mode Write-circuit of static RAM", US005991192A, 1999.

[3]: M. Yamaoka, K. Osada, R. Tsuchiya, M. Horiuchi, S. Kimura and T. Kawahara, "Low power SRAM menu for SOC application using Yin-Yang-feedback memory cell technology", Syrnp. VLSI Circuits Dig. 18, pp. 288-291, 2004.

[4]: B. Giraud, A. Vladimirescu and A. Amara, <<A Comparative Study of 6T and 4T SRAM Cells in Double Gate CMOS with Statistical Variation>>, ISCAS May 2007, New Orleans, USA.

[5]: E. Seevinck Sr. et al., "Static-noise margin analysis of MOS SRAM cells", IEEE JSSCC, vol. 22, pp. 748-754, 1987.

[6]: B. Giraud, A. Vladirnirescu and A. Arnara, <<ln-depth Analysis of 4T SRAM Cells in Double-Gate CMOS>>, ICICDT May 2007, Austin, USA.

[7]: US 2007/0139072 A1

The invention claimed is:

1. A random access memory cell, comprising:
a first double gate access transistor and a second double gate access transistor respectively arranged between a first bit line and a first storage node, and between a second bit line and a second storage node;
a word line connected to a first gate electrode of the first access transistor and to a first gate electrode of the second access transistor;
a first double gate load transistor and a second double gate load transistor;
a first double gate driver transistor and a second double gate driver transistor;
wherein a reference potential is applied to the second gate of the load or driver transistors; and
further comprising a polarization device configured to apply a given variable potential to at least one source or drain electrode of each of the load or driver transistors, the given potential VCELL applied during write phases of the cell being configured to be different from the reference potential and so as to produce a lower drive current of the load or driver transistors during write phases than when the given potential VCELL and the reference potential are equal.

2. A random access memory cell according to claim 1, wherein the polarization device is configured to apply the given potential includes a polarization line.

3. A random access memory cell according to claim 1, the polarization line being connected to a source of the load transistors.

4. A random access memory cell according to claim 3, wherein the polarization device is configured to apply a difference in potential $V_{G1}-V_s$ such that $V_{G1}-V_s=\sigma V$ in which $\sigma V>0$ volt between a first gate electrode and the source electrode of each of the load transistors during data write phases in the cell.

5. A random access memory cell according to claim 4, wherein the polarization device is configured to apply a zero potential difference $V_{G1}-V_s$ between a first gate electrode and a source electrode of each of the load transistors during data read phases in the cell.

6. A random access memory cell according to claim 4, wherein the polarization device is configured to, apply a potential difference $V_{G1}-V_s$ such that $V_{G1}-V_s=\sigma V$ in which $\sigma V>0$ volt between a first gate electrode and a source electrode of each of the load transistors during data retention phases in the cell.

7. A random access memory cell according to claim 3, wherein the load transistors comprise a gate electrode connected to a potential VDD, and the polarization device is further configured to: apply to the source electrode of the load transistors, during at least one data write phase in the cell, a potential VCELL=VDD−σV in which σV>0.

8. A random access memory cell according to claim 7, wherein the polarization device is further configured to: apply to the source electrode of the load transistors, during at least one data read phase of the cell, a potential VCELL=VDD.

9. A random access memory cell according to claim 7, wherein polarization device is further configured to: apply to the source electrode of the load transistors, during at least one data retention phase in the cell,
a potential VDD−σV, in which σV>0.

10. A random access memory cell according to claim 8, wherein σV=$V_{TN}$ in which $V_{TN}$ is the threshold voltage of a double gate transistor.

11. A random access memory cell according to claim 1, wherein the polarization device is further configured to cause the given potential VCELL to vary.

12. A random access memory cell according to claim 11, the polarization device further comprising:
a polarization line placed at a fixed potential; and
at least a first double-gate switching transistor and at least one second double-gate switching transistor between a given polarization line and the polarization line placed at the fixed potential, the first switching transistor being fabricated using technology complementing that of the second transistor, the gates of the first switching transistor and of the second switching transistor being connected together.

13. A random access memory cell according to claim 1, wherein the given potential VCELL is applied by the word line.

14. A random access memory cell according to claim 13, the word line being connected to the source of the load transistors.

15. A random access memory cell according to claim 13, wherein the load transistors comprise a gate electrode connected to a potential VDD, the means to apply the given potential configured to: apply to the source electrode of the load transistors, during at least one data write phase in the cell, a potential VCELL<VDD.

16. A random access memory cell according to claim 15, wherein the polarization device is further configured to: apply to the source electrode of the load transistors, during at least one data read phase in the cell, a potential VCELL<VDD.

17. A random access memory cell according to claim 15, wherein the polarization device is further configured to: apply to the source electrode of the load transistors, during at least one data retention phase of the cell, a potential VCELL=VDD.

18. A random access memory cell according to claim 13, the first access transistor comprising a second gate electrode connected to the second storage node, the second access transistor comprising a second gate electrode connected to the first storage node.

19. A random access memory cell according to claim 13, the word line being connected to the source of the driver transistors.

20. A random access memory cell according to claim 19, wherein the driver transistors comprise a gate electrode connected to a potential VSS, and the polarization device is further configured to: during at least one data write phase in the cell, apply to the source electrode of the driver transistors a potential VCELL>VSS.

21. A random access memory cell according to claim 20, wherein the driver transistors comprise a gate electrode connected to a potential VSS, and the polarization device is further configured to: during at least one data retention phase of the cell, apply to the source electrode of the driver transistors a potential VCELL=VSS.

22. A random access memory cell according to claim 20, wherein the polarization device is further configured to: during at least one data read phase in the cell, apply to the source electrode of the driver transistors a potential VCELL>VSS.

* * * * *